US012592684B2

(12) United States Patent
Yun et al.

(10) Patent No.: US 12,592,684 B2
(45) Date of Patent: Mar. 31, 2026

(54) VOLTAGE MODE RELAXATION OSCILLATOR

(71) Applicant: Seoul National University R&DB Foundation, Seoul (KR)

(72) Inventors: Jaekwang Yun, Michuhol-gu Incheon (KR); Suhwan Kim, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 18/816,604

(22) Filed: Aug. 27, 2024

(65) Prior Publication Data

US 2025/0105826 A1 Mar. 27, 2025

(30) Foreign Application Priority Data

Sep. 22, 2023 (KR) ........................ 10-2023-0126831

(51) Int. Cl.
*H03K 3/0231* (2006.01)
*G05F 3/26* (2006.01)
*H03K 3/011* (2006.01)

(52) U.S. Cl.
CPC ........... *H03K 3/0231* (2013.01); *G05F 3/262* (2013.01); *H03K 3/011* (2013.01)

(58) Field of Classification Search
CPC ........ H03K 3/0231; H03K 4/50; H03K 4/501; H03K 4/502; H03K 3/011; H03B 5/24; H03B 5/04
See application file for complete search history.

(56) References Cited

U.S. PATENT DOCUMENTS 6,020,792 A 2/2000 Nolan et al.
6,157,270 A * 12/2000 Tso ...................... H03K 3/0231
331/111
(Continued)

FOREIGN PATENT DOCUMENTS

CN 114499464 A * 5/2022 ............. H03K 3/011
EP 2706427 B1 3/2014
(Continued)

OTHER PUBLICATIONS

Y. A. Chang et al., "A 13.4-MHz Relaxation Oscillator With Temperature Compensation," in IEEE Transactions on Very Large Scale Integration (VLSI) Systems, vol. 27, No. 7, pp. 1725-1729, Jul. 2019, doi: 10.1109/TVLSI.2019.2908204.
(Continued)

*Primary Examiner* — Ryan Johnson
(74) *Attorney, Agent, or Firm* — WILLIAM PARK AND ASSOCIATES LTD.

(57) ABSTRACT

A voltage mode relaxation oscillator includes a bandgap reference (BGR) circuit configured to generate a BGR voltage that does not depend on temperature and a BGR current that depends on temperature; a control voltage generating circuit configured to generate a control voltage that does not depend on temperature based on the BGR voltage; a reference current generating circuit configured to generate a reference current that does not depend on temperate based on the BGR current; and an oscillator circuit configured to generate a clock signal that does not depend on temperature based on the control voltage and the reference current.

6 Claims, 4 Drawing Sheets

(56) References Cited

U.S. PATENT DOCUMENTS

| | | | | |
|---|---|---|---|---|
| 6,515,551 B1 * | 2/2003 | Mar | ..................... | H03K 3/0231 |
| | | | | 331/185 |
| 11,469,761 B1 | 10/2022 | Palani et al. | | |
| 2016/0070294 A1 * | 3/2016 | Chung | ..................... | G09G 5/12 |
| | | | | 331/8 |

FOREIGN PATENT DOCUMENTS

| | | | |
|---|---|---|---|
| KR | 1020160029593 A | 3/2016 | |
| KR | 1020220085971 A | 6/2022 | |
| KR | 102420193 B1 | 7/2022 | |

OTHER PUBLICATIONS

Ni, Yuchi. "Low-power cmos relaxation oscillator design with an on-chip circuit for combined temperature-compensated reference voltage and current generation." (2013).

T. Tokairin et al., "A 280nW, 100kHz, 1-cycle start-up time, on-chip CMOS relaxation oscillator employing a feedforward period control scheme," 2012 Symposium on VLSI Circuits (VLSIC), Honolulu, HI, USA, 2012, pp. 16-17, doi: 10.1109/VLSIC.2012.6243767.

Y. A. Chang et al., "An On-Chip Relaxation Oscillator With Comparator Delay Compensation," in IEEE Transactions on Very Large Scale Integration (VLSI) Systems, vol. 27, No. 4, pp. 969-973, Apr. 2019, doi: 10.1109/TVLSI.2018.2882376.

Y. H. Chiang et al., "A Submicrowatt 1.1-MHz CMOS Relaxation Oscillator With Temperature Compensation," in IEEE Transactions on Circuits and Systems II: Express Briefs, vol. 60, No. 12, pp. 837-841, Dec. 2013, doi: 10.1109/TCSII.2013.2281920.

* cited by examiner

FIG. 1
(PRIOR ART)
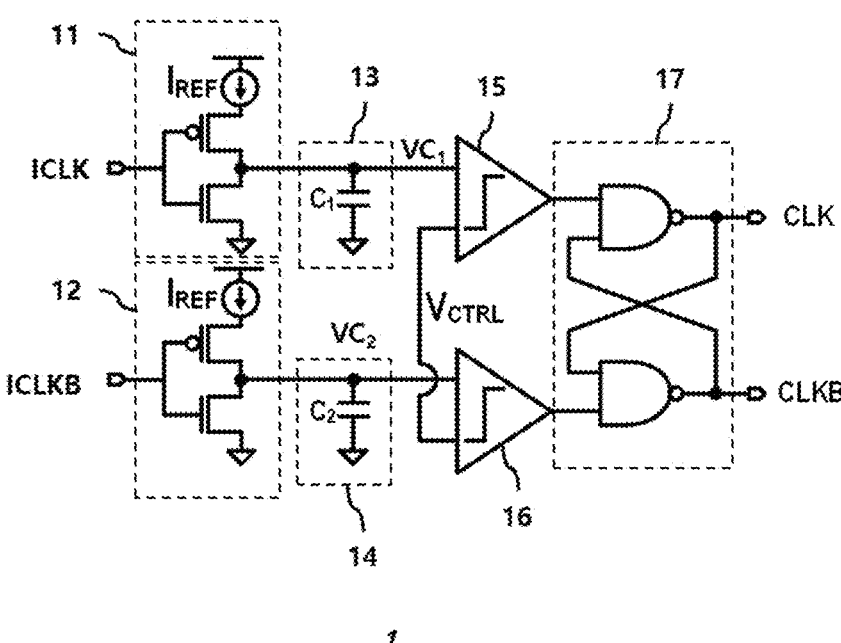
*1*
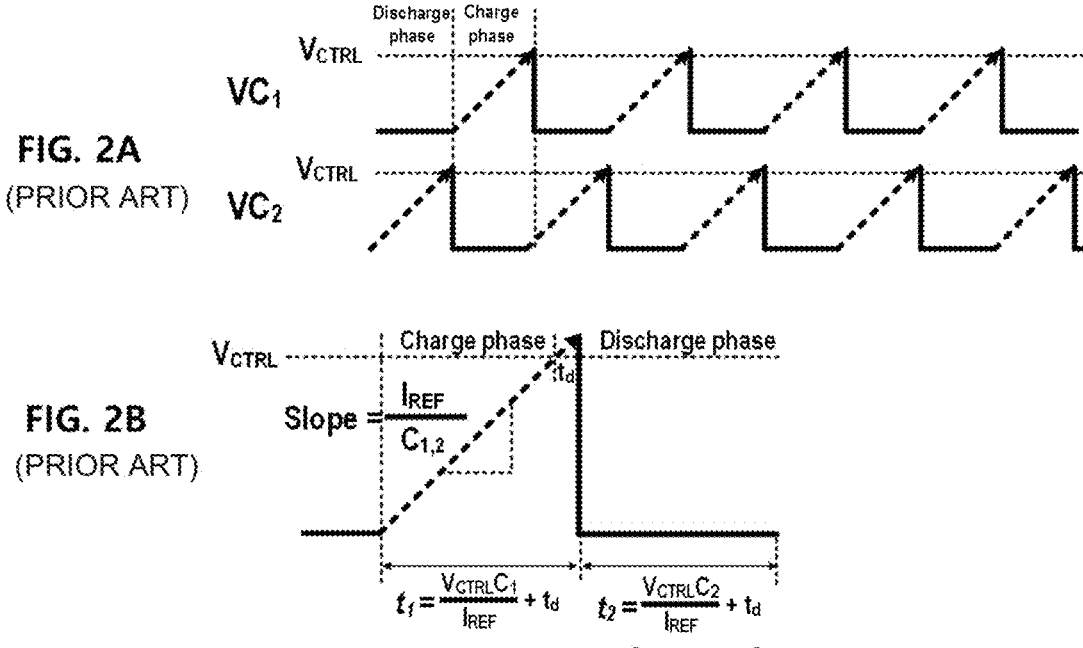
FIG. 2A
(PRIOR ART)
FIG. 2B
(PRIOR ART)

*100*

*110*

_120_

_130_

VOLTAGE MODE RELAXATION OSCILLATOR

CROSS-REFERENCE TO RELATED APPLICATIONS

The present application claims priority under 35 U.S.C. § 119 (a) to Korean Patent Application No. 10-2023-0126831, filed in the Korean Intellectual Property Office on Sep. 22, 2023, which application is incorporated herein by reference in its entirety.

BACKGROUND

1. Technical Field

Embodiments relate to a voltage mode relaxation oscillator, and more specifically, to a voltage mode relaxation oscillator with reduced temperature dependence.

2. Related Art

FIG. 1 is a circuit diagram showing a conventional relaxation oscillator 1.

The conventional relaxation oscillator 1 includes a first inverter 11 for inverting an input clock signal ICLK according to a bias current $I_{REF}$, a second inverter 12 for inverting an inverted input clock signal ICLKB according to the bias current $I_{REF}$, a first capacitor 13 connected to an output terminal of the first inverter 11, a second capacitor 14 connected to an output terminal of the second inverter 12, a first comparator 15 for comparing a first output voltage $VC_1$ output from the first inverter 11 and the control voltage $V_{CTRL}$, a second comparator 16 for comparing a second output voltage $VC_2$ output from the second inverter 12 and the control voltage $V_{CTRL}$, and an SR latch 17 that receives outputs of the first comparator 15 and the second comparator 16 and outputs a clock signal CLK and an inverted clock signal CLKB.

FIG. 2A shows a timing diagram of the first output voltage $VC_1$ and the second output voltage $VC_2$.

The first output voltage $VC_1$ and the second output voltage $VC_2$ have a sawtooth waveform that alternately performs charging and discharging phases.

FIG. 2B represents a first time $t_1$ when the charging phase is performed and the second time $t_2$ when the discharging phase is performed. The sum of the first time $t_1$ and the second time $t_2$ corresponds to an oscillation period $T_{OSC}$.

At this time, the first time $t_1$ is expressed as Equation 1, the second time $t_2$ is expressed as Equation 2, and the oscillation period $T_{OSC}$ is expressed as Equation 3.

$$t_1 = \frac{V_{CTRL} C_1}{I_{REF}} + t_d \qquad \text{[Equation 1]}$$

$$t_2 = \frac{V_{CTRL} C_2}{I_{REF}} + t_d \qquad \text{[Equation 2]}$$

$$T_{OSC} = t_1 + t_2 = 2\left(\frac{V_{CTRL} C_{1,2}}{I_{REF}} + t_d\right) \qquad \text{[Equation 3]}$$

In FIG. 2B, a delay time $t_d$ is the time it takes for the first output voltage $VC_1$ to fall to a low level after it becomes greater than the control voltage $V_{CTRL}$.

As shown, the first time $t_1$ and the second time $t_2$ depend on the control voltage $V_{CTRL}$, the bias current $I_{REF}$, capacitance $C_1$ of the first capacitor 13, and capacitance $C_2$ of the second capacitor 14 and the delay time $t_d$, which are all temperature-dependent values in the conventional relaxation oscillator 1. The capacitances $C_1$ and $C_2$ are the same and are denoted as $C_{1,2}$ in Equation 3.

As such, in the conventional relaxation oscillator 1, there is a problem in that the oscillation period, or oscillation frequency, varies depending on temperature.

To solve this problem, a current mode relaxation oscillator has been proposed that compensates for fluctuations due to temperature changes by using a resistor with a temperature coefficient of the opposite sign as that of the charging current source. However, in the case of such a current mode relaxation oscillator, the duty ratio is low and the swing width of the output clock signal is small, so there is a problem in that the phase noise characteristics are deteriorated.

SUMMARY

In accordance with an embodiment of the present disclosure, a voltage mode relaxation oscillator may include a bandgap reference (BGR) circuit configured to generate a BGR voltage that does not depend on temperature and a BGR current that depends on temperature; a control voltage generating circuit configured to generate a control voltage that does not depend on temperature based on the BGR voltage; a reference current generating circuit configured to generate a reference current that does not depend on temperature based on the BGR current; and an oscillator circuit configured to generate a clock signal that does not depend on temperature based on the control voltage and the reference current.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments that include various features, and explain various principles and beneficial aspects of those embodiments.

FIG. 1 illustrates a conventional relaxation oscillator.

FIGS. 2A and 2B are timing diagrams showing an operation of a conventional relaxation oscillator.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 3:
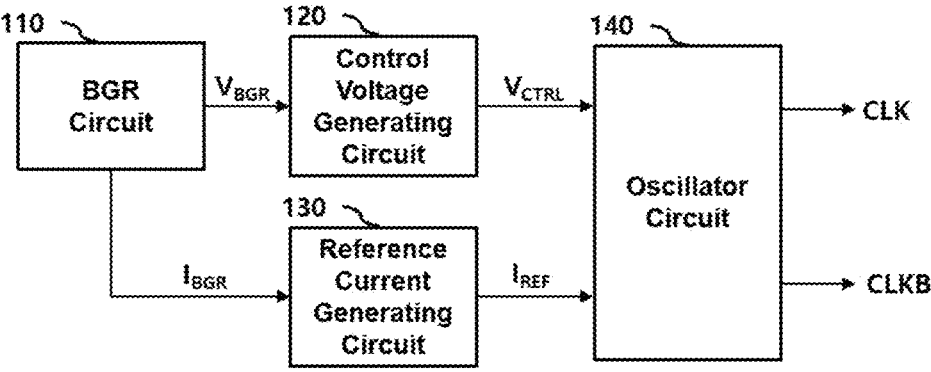
FIG. 3 illustrates a voltage mode relaxation oscillator according to an embodiment of the present disclosure.

FIG. 3 is a block diagram showing a voltage mode relaxation oscillator 100 according to an embodiment of the present disclosure.

The voltage mode relaxation oscillator 100 according to this embodiment includes a bandgap reference (BGR) circuit 110, a control voltage generating circuit 120, a reference current generating circuit 130, and an oscillator circuit 140.

Since the configuration of the oscillator circuit 140 is the same as the conventional relaxation oscillator circuit 1 shown in FIG. 1, detailed description thereof will be omitted.

The BGR circuit 110 is a well-known circuit and generates a BGR voltage $V_{BGR}$ that does not depend on temperature. The BGR circuit 110 generates a temperature-dependent BGR current $I_{BGR}$ in the process of generating the BGR voltage $V_{BGR}$.

Hereinafter, the fact that a value does not depend on temperature indicates that error of the value due to the temperature in the desired temperature range is within a certain range, for example, 0.1%.

The control voltage generating circuit 120 uses the BGR voltage $V_{BGR}$ to generate a control voltage $V_{CTRL}$ that does not depend on temperature, and the reference current generating circuit 130 uses the BGR current $I_{BGR}$ to generate a reference current $I_{REF}$ that does not depend on temperature.

The oscillator circuit 140 uses the control voltage $V_{CTRL}$ and the reference current $I_{REF}$ to generate a clock signal CLK whose oscillation frequency or oscillation period does not depend on temperature.

Figure 4:
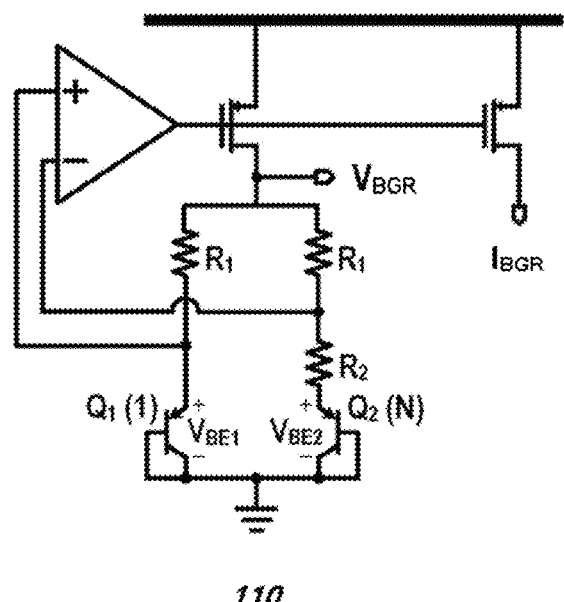
FIG. 4 illustrates a bandgap reference circuit according to an embodiment of the present disclosure.

FIG. 4 is a circuit diagram showing the BGR circuit 110 according to an embodiment of the present disclosure.

As described above, the BGR circuit 110 is the same as the conventional one as disclosed in a prior article ﹐ Ni, Yuchi. (2013). Low-power cmos relaxation oscillator design with an on-chip circuit for combined temperature-compensated reference voltage and current generation. Northeastern University ﹐ , so description of the specific configuration and operation of the BGR circuit 110 will be omitted.

The BGR voltage $V_{BGR}$ is expressed as Equation 4, and the BGR current $I_{BGR}$ is expressed as Equation 5.

By adjusting the ratio of the two resistors $R_1$ and $R_2$ in the BGR circuit 110, a BGR voltage $V_{BGR}$ that does not depend on temperature can be generated. The BGR current $I_{BGR}$ has characteristics that are positively proportional to temperature PTAT, as described in Equation 5.

$$V_{BGR} = \frac{kT}{q}\ln(N)\left(1 + \frac{R_1}{R_2}\right) + v_{BE2} \qquad \text{[Equation 4]}$$

$$I_{BGR} = \frac{kT}{q}\ln(N)\left(\frac{2}{R_2}\right) \qquad \text{[Equation 5]}$$

Figure 5:
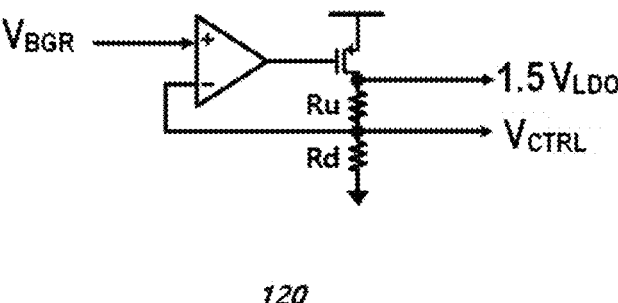
FIG. 5 illustrates a control voltage generating circuit according to an embodiment of the present disclosure.

FIG. 5 is a circuit diagram showing the control voltage generating circuit 120 according to an embodiment of the present disclosure.

The control voltage generating circuit 120 generates the control voltage $V_{CTRL}$ by dividing the BGR voltage $V_{BGR}$ that does not depend on temperature.

Since the circuit in FIG. 5 is substantially the same as a conventionally used voltage dividing circuit, detailed description of its configuration and operation will be omitted.

The control voltage $V_{CTRL}$ can be expressed as Equation 6.

$$V_{CTRL} = \left(1 + \frac{R_u}{R_d}\right)V_{BGR} \qquad \text{[Equation 6]}$$

Figure 6:
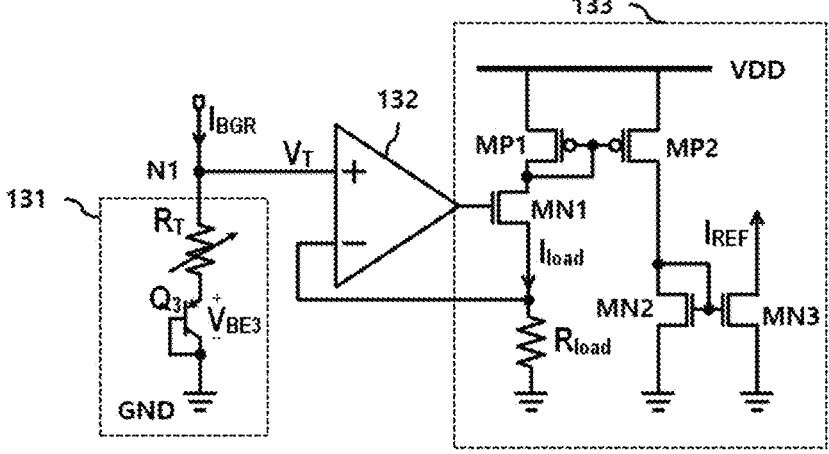
FIG. 6 illustrates a reference current generating circuit according to an embodiment of the present disclosure.

FIG. 6 is a circuit diagram showing the reference current generation circuit 130 according to an embodiment of the present invention.

As described above, the reference current generating circuit 130 calibrates the BGR current $I_{BGR}$ having PTAT characteristics and generates a reference current $I_{REF}$ that does not depend on temperature.

The reference current generating circuit 130 includes an input circuit 131 connected between a first node N1 receiving the BGR current $I_{BGR}$ and the ground node GND, an operational amplifier 132, and an output circuit 133.

The input circuit 131 includes a resistor $R_T$ and a diode-connected transistor $Q_3$. The resistor $R_T$ is connected between the first node N1 and an emitter of the diode-connected transistor $Q_3$. A collector of the diode-connected transistor $Q_3$ is connected to the ground node GND.

In this embodiment, the diode-connected transistor $Q_3$ is a PNP-type bipolar junction transistor BJT.

The positive input terminal of the operational amplifier 132 is connected to the first node N1.

The output circuit 133 includes an NMOS transistor MN1 whose gate is connected to an output terminal of the operational amplifier 132, and a load resistor $R_{load}$ connected between the source of the NMOS transistor MN1 and the ground node GND.

At this time, the source of the NMOS transistor MN1 is connected to a negative input terminal of the operational amplifier 132.

The output circuit 133 further includes a current mirror circuit that outputs the reference current $I_{REF}$ by mirroring a load current $I_{load}$ flowing through the load resistor $R_{load}$.

The current mirror circuit is implemented using PMOS transistors MP1 and MP2 and NMOS transistors MN2 and MN3.

In the PMOS transistor MP1, a gate and a drain thereof are connected to each other, a source thereof is connected to the power supply node VDD, and the drain thereof is connected to the drain of the NMOS transistor MN1 of the output circuit 133.

A gate of the PMOS transistor MP2 is connected to the gate of the PMOS transistor MP1, and a source of the PMOS transistor MP2 is connected to the power supply node VDD.

In the NMOS transistor MN2, a gate and a drain thereof are connected to each other, the drain thereof is connected to a drain of the PMOS transistor MP2, and a source thereof is connected to the ground node GND.

A gate of the NMOS transistor MN3 is connected to the gate of the NMOS transistor MN2, the source thereof is connected to the ground node GND, and the reference current $I_{REF}$ is output from the drain thereof.

Since the operation method of the current mirror circuit is well known, detailed description of the operation is omitted.

In the reference current generating circuit 130, the voltage of the first node N1, that is, the input voltage $V_T$, is expressed as Equation 7.

$$V_T = V_{BE3} + I_{BGR}R_T \qquad \text{[Equation 7]}$$

In Equation 7, $V_{BE3}$ represents a voltage between the base and emitter of the diode-connected transistor $Q_3$.

If the mirroring ratio of the current mirror circuit is 1:1, the reference current $I_{REF}$ can be expressed as Equation 8.

$$I_{REF} = I_{load} = \frac{V_T}{R_{load}}$$ [Equation 8]

By combining Equation 5, Equation 7, and Equation 8, the reference current $I_{REF}$ can be expressed as Equation 9.

$$I_{REF} = \frac{v_{BE3}}{R_{load}} + \frac{R_T}{R_{load}}I_{BGR} = \frac{V_{BE3}}{R_{load}} + \frac{R_T}{R_4}\frac{kT}{q}\ln(N)\left(\frac{2}{R_2}\right)$$ [Equation 9]

By adjusting the variable resistance $R_T$ in Equation 9, the reference current $I_{REF}$ that does not depend on temperature can be generated.

Figure 7:
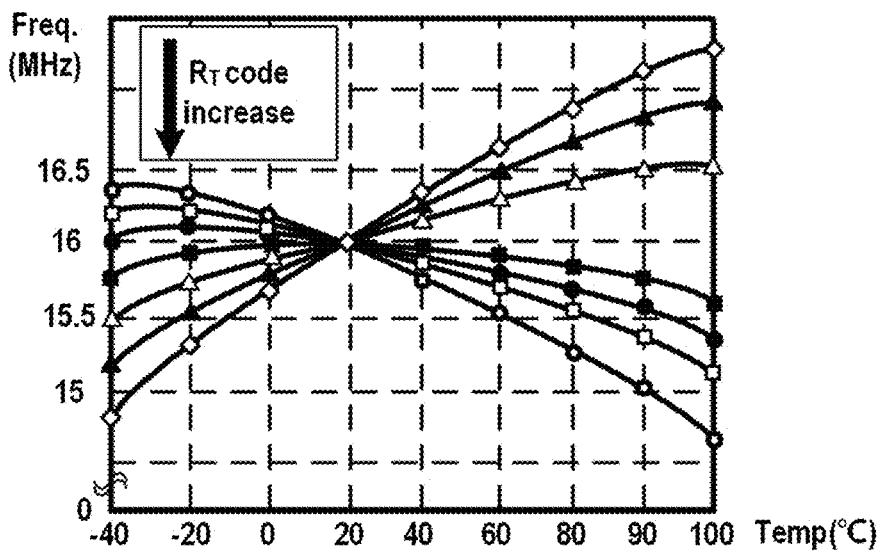
FIG. 7 is a graph showing an error of oscillation frequency according to a variable resistor.

FIG. 7 is a graph showing frequency error according to variable resistance $R_T$.

The horizontal axis of the graph represents temperature, and the vertical axis of the graph represents frequency error. As the variable resistance $R_T$ increases, the graph changes from a graph represented with white circles to a graph represented with white diamonds.

As shown, when the variable resistance $R_T$ is the largest, such as a graph represented with white diamonds, and when the variable resistance $R_T$ is the smallest, such as a graph represented with white circles, the frequency error is large.

The graph represented with black squares has the lowest frequency error in the desired temperature range, for example, between −20° C. and 40° C.

Figure 8:
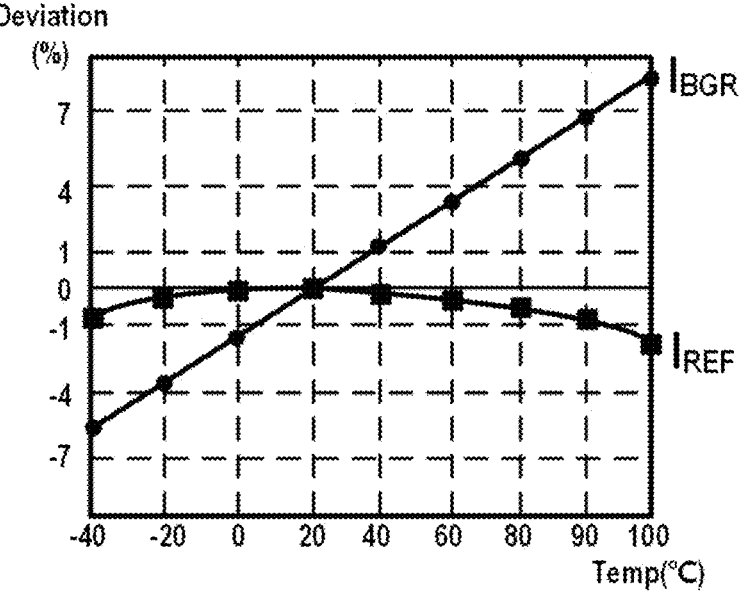
FIG. 8 is a graph showing characteristics of a reference current and a BGR current according to an embodiment of the present disclosure.

FIG. 8 is a graph comparing the temperature characteristics of the BGR current $I_{BGR}$ and the reference current $I_{REF}$.

The reference current $I_{REF}$ in FIG. 8 corresponds to a graph represented with black squares in FIG. 7.

The horizontal axis of the graph corresponds to temperature, and the vertical axis of the graph represents deviation of current. As shown in the graph, the reference current $I_{REF}$ shows a current deviation of less than 1.5% in the temperature range between −20° C. and 40° C.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A voltage mode relaxation oscillator comprising:
a bandgap reference (BGR) circuit configured to generate a BGR voltage that does not depend on temperature and a BGR current that depends on temperature;
a control voltage generating circuit configured to generate a control voltage that does not depend on temperature based on the BGR voltage;

a reference current generating circuit configured to generate a reference current that does not depend on temperature based on the BGR current, the reference current generating circuit comprising:
an input circuit having a first node receiving the BGR current and coupled between the first node and a ground node;
an operational amplifier having a positive input node coupled to the first node; and
an output circuit coupled to an output node of the operational amplifier, the output circuit comprising:
a transistor having a gate coupled to the output node of the operational amplifier and a source coupled to a negative input node of the operational amplifier; and
a load resistor coupled between the negative input node of the operational amplifier and the ground node; and
an oscillator circuit configured to generate a clock signal that does not depend on temperature based on the control voltage and the reference current.

2. The voltage mode relaxation oscillator of claim 1, wherein the input circuit comprises:
a variable resistor having a first terminal coupled to the first node; and
a diode-connected transistor coupled between a second terminal of the variable resistor and the ground node.

3. The voltage mode relaxation oscillator of claim 2, wherein the diode-connected transistor is a PNP-type bipolar junction transistor having an emitter coupled to the second terminal, and a collector and a base coupled to the ground node.

4. The voltage mode relaxation oscillator of claim 1, wherein the output circuit further comprises a current mirror circuit generating the reference current by mirroring a load current flowing through a load resistor.

5. The voltage mode relaxation oscillator of claim 1, wherein the control voltage generating circuit divides the BGR voltage to generate the control voltage.

6. The voltage mode relaxation oscillator of claim 1, wherein the oscillator circuit comprises:
a first inverter for inverting a clock signal according to the reference current;
a second inverter for inverting an inverted clock signal according to the reference current;
a first capacitor connected to an output terminal of the first inverter;
a second capacitor connected to an output terminal of the second inverter;
a first comparator for comparing an output of the first inverter and the control voltage;
a second comparator for comparing an output of the second inverter and the control voltage; and
an SR latch for providing a clock signal and an inverted clock signal based on outputs of the first comparator and the second comparator.

* * * * *